United States Patent [19]

Rizzo et al.

[11] Patent Number: 5,197,889
[45] Date of Patent: Mar. 30, 1993

[54] ELECTRICAL CONTACT FOR BATTERY PACKAGE OR SIMILAR DEVICE

[75] Inventors: Matthew Rizzo, Plantation; Mark S. Bresin, Coral Springs, both of Fla.

[73] Assignee: Motorola, Inc., Schaumburg, Ill.

[21] Appl. No.: 829,642

[22] Filed: Feb. 3, 1992

[51] Int. Cl.$^5$ .................................... H05K 1/18
[52] U.S. Cl. ........................... 439/76; 429/99; 439/500
[58] Field of Search ............ 439/67, 76, 77, 500; 361/398; 429/99, 100, 178, 179

[56] References Cited

U.S. PATENT DOCUMENTS

| | | | |
|---|---|---|---|
| 3,553,033 | 1/1971 | Page | 429/178 |
| 4,117,203 | 9/1978 | Sjogren | 429/178 |
| 4,417,776 | 11/1983 | Motoyama | 429/77 |
| 4,970,624 | 11/1990 | Arneson et al. | 361/398 |
| 5,001,604 | 3/1991 | Lusby | 361/398 |
| 5,006,073 | 4/1991 | Mennona | 439/77 |
| 5,103,375 | 4/1992 | Cottingham | 361/398 |

Primary Examiner—Neil Abrams
Attorney, Agent, or Firm—Dale W. Dorinski

[57] ABSTRACT

An electrical contact (150) in a housing (110) is created by forming an opening (112) in a wall of the housing. A circuit assembly (130) situated inside the housing (110) has a conductive member (140) that is formed to be of substantially the same shape as the opening (112) in the housing. A portion (150) of the conductive member (140) fits into the opening (112) and a second portion is adhesive bonded to the circuit assembly (130). The electrical interconnection (145) between the conductive member (140) and a copper circuit pattern (134) on the circuit assembly (130) is made by creating a hole or via (145) through the conductive member down to the copper circuit pattern and plating copper (147) into the hole or filling the hole with conductive polymers. A battery package (100) is made by adding additional electrical components to the circuit assembly (130) and connecting a plurality of cells (120) to the circuit assembly.

19 Claims, 4 Drawing Sheets

ELECTRICAL CONTACT FOR BATTERY PACKAGE OR SIMILAR DEVICE

TECHNICAL FIELD

This invention relates generally to electrical contacts and more specifically to electrical contacts in a housing.

BACKGROUND

It is often desirable to have electrical contacts which are mounted into a housing wall. For example, a portable, two-way radio typically includes a battery portion which has both charger contacts and contacts for connection to the radio. Various approaches are used for mounting the contacts, such as ultrasonic welding of contact carriers or the use of molded-in contacts. It is also necessary to connect the contacts to the circuit on the inside of the housing. One known approach uses rivets which are fixed to a flex circuit. Rivets, however, do not produce highly reliable electrical connections to flex circuits and require ultrasonic welding or heat staking of the contact carrier to the housing wall. It is desirable to have a contact that can be surface mounted to a flex circuit and fit directly into an opening in the housing.

U.S. Pat. No. 5,006,073 by Mennona, incorporated herein by reference, describes an electrical contact for a battery that can be snap fit into an opening in the housing. The contacts are stamped or formed from thin metal and have surfaces protruding from the walls of the contacts that include a snap feature that mates with the wall of the housing. The contacts are attached to the flex circuit by soldering. While this method of providing contacts in the housing wall provides for a low-cost, easily manufactured contact assembly, it still requires that the contacts themselves be separate piece parts and be soldered to the flex circuit in order to make the proper fit. A contacting system or scheme that could eliminate the need for additional pieces and also eliminate the soldering step would be desirable.

SUMMARY OF THE INVENTION

Briefly, according to the invention, there is provided an electrical contact for a housing, comprising a housing and a circuit assembly. The housing has at least one opening in one or more walls of the housing and the circuit assembly is situated within the housing. The circuit assembly includes a substrate material having a conductive circuit pattern on one or more sides of the substrate and an adhesive material bonded to the substrate. A conductive member is bonded to the adhesive material and is electrically connected to the conductive circuit pattern. A portion of the conductive member has a shape substantially the same as the shape of the opening in the housing. This portion is situated within the housing opening so as to form an electrical contact in the housing wall.

In another embodiment of the invention, the housing comprises a battery housing for a portable, two-way radio or other electrical device. A plurality of cells are situated within the housing. A flexible circuit is formed to interconnect the plurality of cells, and an adhesive material is bonded to a portion of the flexible circuit. A conductive member is attached to the adhesive material and electrically connected to a circuit pattern on the flex circuit. The conductive member is shaped so as to fit in or correspond to the opening in the battery housing.

DETAILED DESCRIPTION OF THE PREFERRED EMBODIMENT

Figure 1:
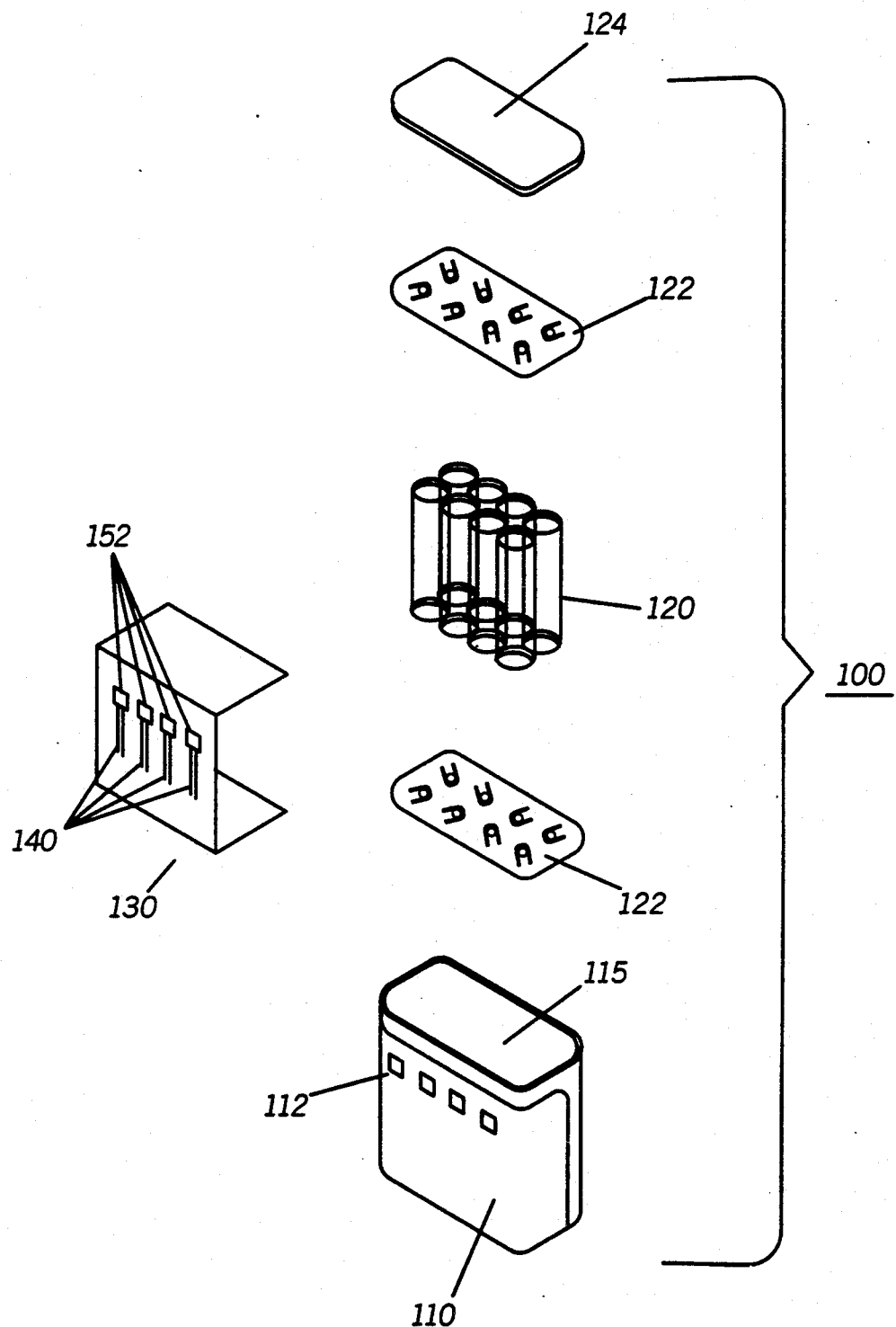
FIG. 1 is an exploded view of electrical contacts in a battery package in accordance with the invention.

Referring to FIG. 1, a battery package 100 such as a re-chargeable battery or other similar device, consists of a housing 110 having a plurality of battery cells 120 contained within. The cells 120 are electrically interconnected and are further connected to a flex circuit 130 or other substrate, such as a semi-flexible circuit or a rigid circuit board, by means of tabs or interconnects 122. The interconnect 122 is shown in FIG. 1 as a metal sheet having spring fingers to hold the cells 120 against respective contact points (not shown) on the flex circuit 130, but the interconnect may alternatively consist of metal tabs welded between the individual cells 120 and to the flex circuit 130. Other methods of directly interconnecting the cells 120 and the flex circuit 130 may also be used to achieve the desired connections. The housing 110 has walls that have one or more openings 112 therein so as to penetrate from the interior 115 of the housing to the exterior of the housing. The openings 112 can be of any shape but are preferably circular or rectangular. The battery package 100 is typically closed by covering the open end of the housing 110 with a cover or lid 124.

Figure 2:
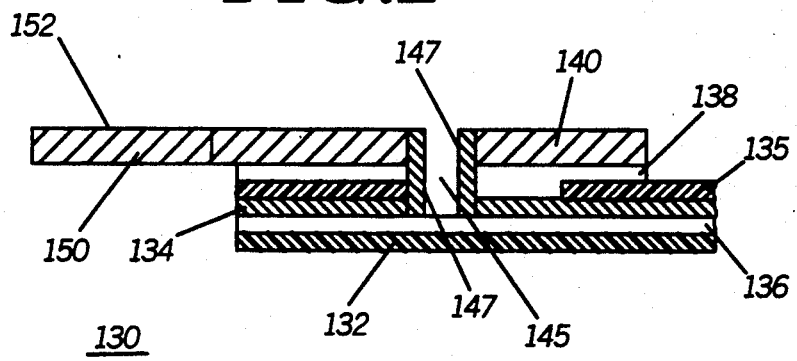
FIG. 2 is a cross-sectional view of a conductive member adhered to a flexible circuit in accordance with the invention.

Referring now to FIG. 2, a cross-sectional view shows the flex circuit 130 consists of a substrate, preferably formed of a flexible insulative material such as a film of polyimide 132, having laminated to it a layer of conductive material 134, such as copper, silver filled ink, nickel, aluminum, or conductive polymers, which defines a circuit pattern. The conductive material 134 may be attached to the polyimide 132 in a number of ways. For example, a layer of adhesive 136 can be interposed between the conductive material 134 and the polyimide 132, or the conductive material 134 may be attached by electroless plating, screen printing, or by sputtering a metal directly onto the polyimide 132. In the latter methods, the adhesive 132 is not used and adhesion of the conductive material 134 to the polyimide 132 is achieved by chemical bonding. The conductive material 134 is typically imaged and then etched into a circuit pattern in accordance with the conventional art. The circuit pattern may also have other components soldered to it in order to provide appropriate functions in the battery package 100. For example, components such as resistors for coding the battery, thermistors for sensing the battery temperature, thermal overload switches, diodes for prevention of accidental battery discharge, capacitors, transistors, and microprocessors or other semiconductor devices may be attached to the conductive material 134. Alternate materials may be substituted for the polyimide 132, depending upon the required application. For example, polyamides, polyamideimide, polyetherimides, polyesters, polyvinylchlorides, polyparabanic acids, fluoropolymers, aramides, nylons, epoxies, and various combinations of these materials may be employed as substrates for the flex circuit 130. In addition, a more rigid substrate can be substituted for the polyimide 132 if desired. For example, a material known as BENDFLEX ® from Rogers Corporation is a semiflexible substrate that finds applications in electronics packages. Other applications may require a rigid substrate, in which case conventional circuit board materials such as FR4, G10, reinforced polyimide, etc., may be used in place of the polyimide 132. In any event, each of these substrates typically also has a circuit pattern imposed thereon.

In order to form the electrical contact member which fits within the opening 112 of the housing wall, a second conductive member 140 is attached to the flex circuit 130 during the manufacture of the flex circuit. This conductive member 140 is typically a metal such as copper, but may also be material such as nickel, nickel/silver, brass, or aluminum, and may also be further plated with a number of materials such as nickel, chrome, copper, gold, tin, solder, etc. The conductive member 140 is affixed to the flex circuit 130 by using an adhesive 138. A portion of the conductive member 140 is bonded directly to the polyimide 132 or the conductive material 134 with the adhesive 138. The adhesive 138 is then cured by radiation, heat, or light, as required, or it may be a thermoplastic material such as a hot-melt or a pressure-sensitive adhesive. The adhesive 138 serves to bond the conductive member 140 to the flex circuit 130. The adhesive 138 may cover only the polyimide 132, or it may cover only the conductive material 134, or it may cover portions of both. In any case, a judicious amount of adhesive 138 is used to secure the conductive member 140 to the flex circuit 130.

If desired, a cover coat 135 of film similar to that employed as the flex circuit base material 132 may be applied over the conductive material 134. The use of cover coats is well known to those skilled in the flex circuit art. Cover coats are typically applied by adhesively bonding a film or cover coat 135 over the conductive material 134 and the polyimide 132. Openings in the cover coat 135 are formed so as to expose the conductive material 134 in strategic areas. A cover coat 135 may also be directly applied by depositing a liquid film onto the flex circuit 130 and photoimaging the film so as to expose appropriate areas of the conductive material 134. If a cover coat 135 is employed, the adhesive 138 needed to adhere the conductive member 140 to the flex circuit 130, may also cover portions of the cover coat.

Connection is then made between the conductive member 140 and the conductive material 134 by forming a hole 145 through the conductive member and the conductive material. The hole 145 shown in FIG. 2 is depicted as a blind via, but may also be formed so as to penetrate completely through all of the layers of the flex circuit 130. The hole 145 is typically created by drilling, and more than one hole per conductive member 140 may be employed. The hole 145 may be further created by means of a laser, a punch, or a die. The hole 145 is then filled with a conductive material such as a conductive polymer or metal filled polymer, or plated up with additional metal 147 in order to form an electrical interconnect or plated-thru hole between the conductive member 140 and the underlying conductive material 134. The processes for forming the plated-thru hole are well known in the art of the printed circuit board fabrications. Typically, the hole 145 is cleaned of debris by a de-burring operation, a plasma-cleaning, a permanganate etch, or a combination of these treatments. A thin layer of electroless copper is then plated into the hole 145 and also on portions of the conductive member 140 and the conductive material 134. Additional copper plating 147 is then applied by electrochemical methods in order to build the wall of hole 145 to a suitable thickness, typically between 0.01 mm and 0.03 mm. In this way, all the electrical connections between the conductive member 140 and the conductive material 134 are formed simultaneously.

In an alternate embodiment, the conductive member 140 is bonded or adhered to a side of the flex circuit 130 that is opposite to the side having the conductive material 134. In this embodiment, interconnection between the conductive member 140 and the conductive material 134 is made by forming the hole 145 completely through the polyimide 132.

The conductive member 140 is typically thicker than the underlying conductive material 134 and is also stiffer. For example, the conductive material 134 is typically 0.01 to 0.07 mm thick with 0.02 to 0.05 mm being the preferred range, and it is usually very ductile. The conductive member 140 may range from 0.05 to 1 mm in thickness, and should be stiffer than the conductive material 134 in order to retain its shape and fit properly into the housing opening 112.

As can be seen in FIG. 2, a portion 150 of the conductive member 140 lies unsupported beyond the edge of the flex circuit 130. This preferred embodiment allows for later forming of the conductive member 140 to the desired configuration.

Figure 3:
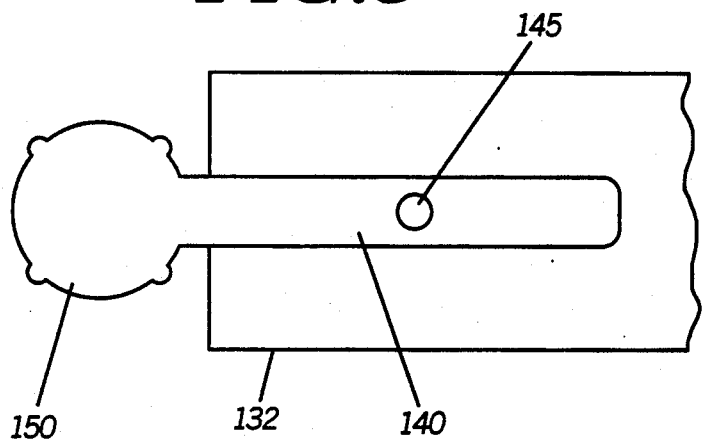
FIG. 3 is a plan view of the cross-sectional view shown in FIG. 2.
Figure 4:
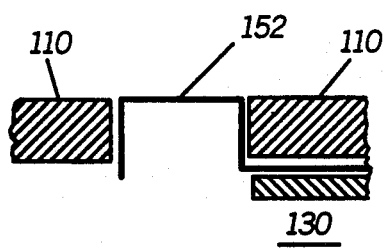
FIGS. 4–18 are cross sectional views of alternate embodiments of a portion of the conductive member.
Figure 6:
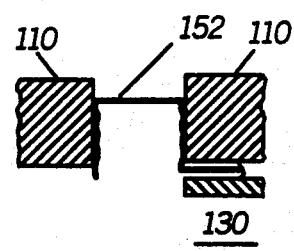
Figure 7:
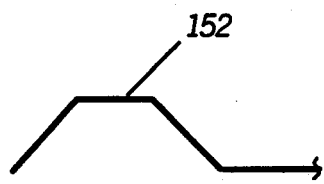
Figure 8:
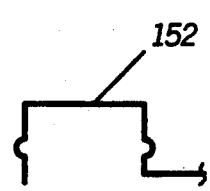
Figure 9:
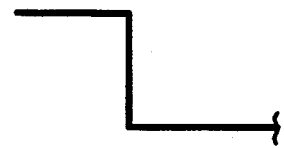
Figure 10:
Figure 11:
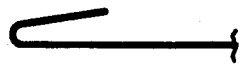
Figure 12:
Figure 13:
Figure 14:
Figure 15:
Figure 16:
Figure 17:
Figure 18:

The next step is to form or shape the conductive member 140. If it is to be formed prior to attachment to the flex circuit 130, obviously this step would not occur at this point, but would occur prior to the adhesive bonding step. The conductive member 140 is formed to the desired shape, for example, by etching, stamping, laser cutting, bending, die cutting, extrusion, punching, coining, or any other means necessary to achieve the desired configurations. Methods of shaping the conductive member 140 are well known in the metal working arts and are readily discernible to one with ordinary skill in the art. The final shape of the conductive member 140 depends upon the desires of the individual designer. A typical shape is shown in a plan view in FIG. 3. The shape of this portion 150 of the conductive member 140 should substantially correspond to the shape of the opening 112 in the housing wall. Other configurations similar in nature or intent will be readily apparent to the skilled designer. For example, FIGS. 4-18 show cross sectional views of some possible examples that the shaped portion 150 of the conductive member 140 may assume. A cup may be formed as shown in cross-sectional view in FIG. 5 where the sidewalls of the cup are essentially vertical. The sidewalls may also be slanted or tapered (FIG. 7), may contain protrusions (FIG. 4, FIG. 8), or be roughened or irregularly shaped (FIG. 6) to aid in locating or retaining the portion 150 of the conductive member 140 in the housing opening 112. The shaping operation may also provide features that aid in retaining the conductive member 150 in the housing opening 112, such as stakes or detents (FIG. 4). Other configurations such as an 'L'-shape (FIG. 9), a contoured shape (FIG. 10), a 'Dutch Bend' (FIG. 11), multiple 'Dutch Bends' (FIG. 12), 'S'-shapes and triangular shapes that form a spring member (FIGS. 13-16), and curled or spiral shapes (FIG. 17) can also be employed. These shapes are shown here in cross section only, and the full three dimensional form of this portion 150 of the conductive member 140 can be a cup, a folded hat section, a 'U'-shape, or a box having 3, 4, 5, or 6 sides. The shape of this portion 150 of the conductive member 140 is typically circular when viewed from above but may be other forms such as rectangular, square, triangular, or other regular or irregular polygons. It should also be understood that these examples are by way of illustration only and are not meant to restrict the reader from implementing other configurations to achieve a similar result.

Figure 5:
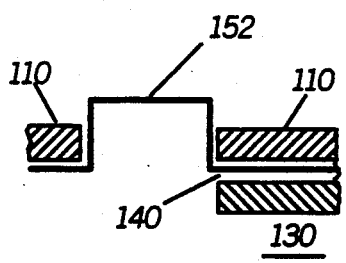

The forming or shaping operation modifies the configuration of the conductive member 140 in order to aid in fixturing it in the housing. The shaped, conductive member may end up as a planar member or it may be shaped in multiple planes so as to form a cup, cone, rivet, flap, stud, and so forth. By fabricating the conductive member 140 in multiple planes, the height of the contact surface 152 is significantly raised above the level of the flex circuit 130. For example, simply attaching a planar 0.37 mm thick conductive member 140 to the flex circuit 130 raises the upper contact surface 152 of the conductive member about 0.37 mm above the flex circuit. When the formed conductive member 140 is inserted into the opening in the housing 112, it could lie below the plane of the exterior of the housing 110 if the housing wall thickness exceeds about 0.37 mm. Typically, most molded plastic housing walls are greater than 0.37 mm and may range as high as 2.5 mm. By forming the conductive member 140 into a cup or similar shape, the height of the upper contact surface 152 can be raised well beyond the surface of the flex circuit 130. As can be seen in FIG. 5, the upper surface 152 of the conductive member 140 is significantly higher than the corresponding thickness of the conductive member. In this way, the shaped conductive member 140 provides for a contact surface 152 that is co-planar or even extends beyond the exterior plane of the wall of the housing 110, no matter how thick the housing wall may be.

The unsupported portion 150 may lie off the perimeter of the flex circuit 130 edge or it may alternatively lie across a hole or opening formed within the flex circuit. By situating a portion 150 of the conductive member 140 so that there is no underlying substrate, the conductive member may be more easily formed or shaped. Although not a preferred embodiment, this second portion 150 of the conductive member 140 may also be situated so that it lies directly over the polyimide 132. This configuration is not as amenable to being formed, but nonetheless, it may be formed or shaped if so desired.

After the flex circuit 130 is fabricated, it is then assembled into the housing 110. Additional parts, such as resistors, diodes, transistors, capacitors, switches, thermistors, and so forth, may be added, for example, by soldering. In the case of the preferred embodiment, the flex circuit 130 is connected to a plurality of battery cell 120, and this cell and flex assembly is inserted into the housing 110 with the portions 150 of the conductive members 140 fitting into the opening 112 in the housing wall. More than one conductive member 140 is used if multiple contacts are needed in the finished package 100.

Figure 19:
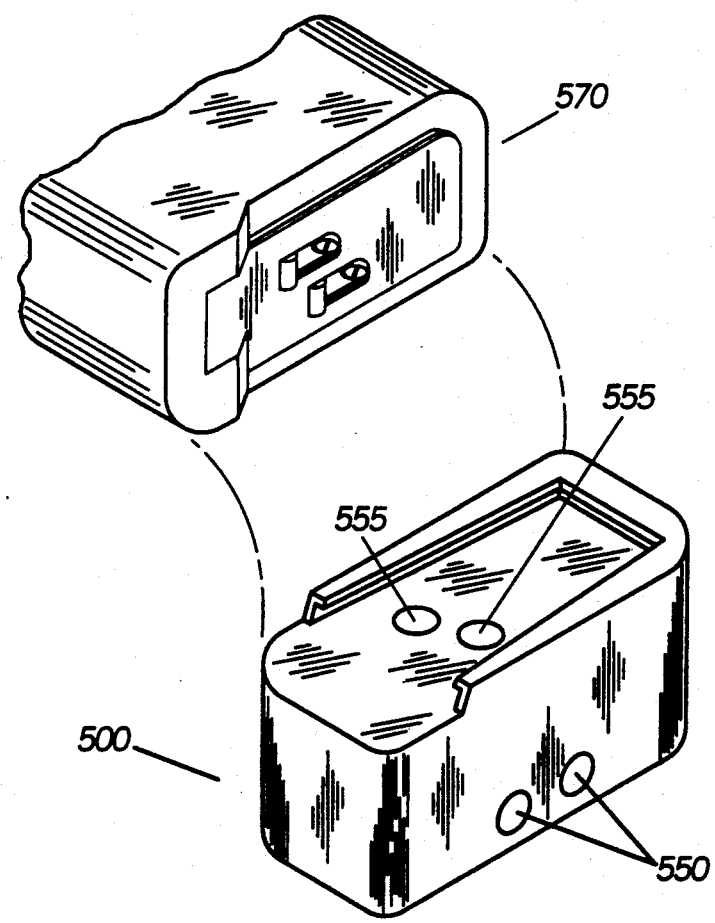
FIG. 19 is an isometric view of electrical contacts in a battery package connected to a communications device in accordance with the invention.

Referring now to FIG. 19, a battery package 500 may be formed with electrical contacts for charging 550 and electrical contacts for connection 555 to a portable radio 570. Although the preferred embodiment describes a battery package 500 for an energy consuming device such as a portable radio 570, applications in other electrical apparatus may be easily envisioned. For example, contacts 150 formed by the conductive member 140 may be used as contact surfaces 152 for switches, such as in popple switches, rotary switches, slide switches, and so forth. They may further be used as a spring member, as test probe points, or as heating elements if made from an alloy having high electrical resistance. The invention as described herein may find use in numerous electrical and electronic devices, such as watches, calculators, cameras, motors, computers, electronic games, battery packages, radios, and so on.

The electrical contacts so formed are intended for use as a contact surface as distinguished from other prior art that provides plug-in terminations on flex circuits. The invention described herein eliminates the need to solder additional parts, such as rivets or studs, onto the flex circuit and overcomes the attendant problems associated with the conventional art, such as added material costs, added labor costs, dimensional tolerance problems, soldering operations, soldering defects and reliability problems.

What is claimed is:

1. An assembly including an electrical contact, comprising:
    a housing having multiple walls and having at least one opening in at least one of said walls; and
    a circuit assembly situated within said housing, the circuit assembly comprising:
        a substrate material having two major opposed faces;
        a conductive circuit pattern on at least one face of said substrate material; and
        a conductive member having first and second portions, said first portion bonded to said substrate with a polymeric, non-conductive adhesive and electrically connected to said conductive circuit pattern by means of a plated through hole, said second portion having a shape substantially the same as said housing opening and situated within said opening to form an electrical contact in said housing wall.

2. A housing including an electrical contact, comprising:
    a housing having multiple walls and having at least one opening in at least one of said walls; and
    a flexible circuit situated within said housing, the flexible circuit comprising:
        a flexible film material having two opposed faces;
        a conductive circuit pattern on at least one face of said flexible film material;
        a polymer adhesive material bonded to at least a portion of said flexible circuit;
        an integral conductive member having first and second portions, said first portion bonded to said polymer adhesive material and electrically connected to said conductive circuit pattern, said second portion having a shape substantially the same as said housing opening and situated within said opening to form an electrical contact in said housing wall; and
        said conductive member formed during the fabrication of the flexible circuit.

3. The electrical contact as described in claim 2, wherein said flexible film material is selected from the group consisting of polyimides, polyamides, polyamide-imides, polyetherimides, polyesters, polyvinyl chlorides, polyparabanic acids, fluoroploymers, aramids, nylons, epoxies, and combinations thereof.

4. The electrical contact as described in claim 2, wherein said first conductive circuit pattern is copper, silver filled ink, nickel, aluminum, or a conductive polymer.

5. The electrical contact as described in claim 2, wherein said housing is a battery package housing.

6. The electrical contact as described in claim 5, further comprising a plurality of battery cells electrically connected to said flexible circuit and situated within said housing.

7. The electrical contact as described in claim 2, wherein said flexible circuit further comprises at least one covercoat.

8. The electrical contact as described in claim 7, wherein said adhesive material covers at least a portion of said covercoat and is bonded to said at least a portion of said covercoat.

9. The electrical contact as described in claim 2, wherein said flexible circuit further comprises one or more electrical components selected from the group consisting of resistors, diodes, transistors, capacitors, switches, and thermistors.

10. The electrical contact as described in claim 2, wherein said second portion of said conductive member is formed into a three dimensional shape.

11. The electrical contact as described in claim 10, wherein said second portion of said conductive member is formed so as to extend beyond said housing wall when situated within said opening.

12. The electrical contact as described in claim 10, wherein said second portion of said conductive member is formed so as to be coplanar with said housing wall when situated within said opening.

13. The electrical contact as described in claim 2, wherein said second portion of said conductive member is formed so as to provide an interference fit in said opening.

14. The electrical contact as described in claim 2, wherein said first portion of said conductive member is electrically connected to said conductive circuit pattern by means of at least one plated through hole.

15. The electrical contact as described in claim 2, wherein said adhesive material is bonded to a second face of said flexible film material, and said conductive member is bonded to said adhesive material so as to be on a side of said flexible film material opposite to said conductive circuit pattern.

16. A battery package, comprising:
a housing having multiple walls and having at least one opening in at least one of said walls;
a plurality of cells situated within said housing; and
a flexible circuit electrically connected to said plurality of cells and situated within said housing, the flexible circuit comprising:
an insulating flexible film having two opposed faces;
a copper circuit pattern on at least one face of said flexible film;
a polymer adhesive material bonded to at least a portion of said copper circuit pattern or said flexible film;
a conductive member having first and second portions, said first portion bonded to said adhesive material and electrically connected to said copper circuit pattern by means of at least one plated through hole, said second portion having a shape substantially the same as said housing opening and formed so as to substantially fit within said opening to form an electrical contact in said battery housing wall;
said conductive member being an integral part of the flexible circuit and formed during fabrication of the flexible circuit; and
one or more electrical components selected from the group consisting of resistors, diodes, transistors, capacitors, switches, and thermistors, said components soldered to said copper circuit pattern.

17. The battery package as described in claim 16, wherein said flexible film base material is selected from the group consisting of polyimides, polyamides, polyamide-imides, polyetherimides, polyesters, polyvinyl chlorides, fluoropolymers, aramids, nylons, epoxies, and combinations thereof.

18. The battery package as described in claim 16, wherein said circuit assembly further comprises at least one covercoat.

19. The battery package as described in claim 18, wherein said adhesive material covers at least a portion of said covercoat and is bonded to said at least a portion of said covercoat.

* * * * *